United States Patent
Joshi

(10) Patent No.: US 9,257,365 B2
(45) Date of Patent: Feb. 9, 2016

(54) COOLING ASSEMBLIES AND POWER ELECTRONICS MODULES HAVING MULTIPLE-POROSITY STRUCTURES

(71) Applicant: Toyota Motor Engineering & Manufacturing North America, Inc., Erlanger, KY (US)

(72) Inventor: Shailesh N. Joshi, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 325 days.

(21) Appl. No.: 13/935,686

(22) Filed: Jul. 5, 2013

(65) Prior Publication Data
US 2015/0009631 A1 Jan. 8, 2015

(51) Int. Cl.
*H01L 23/433* (2006.01)
*H01L 23/473* (2006.01)
(Continued)

(52) U.S. Cl.
CPC .......... *H01L 23/4336* (2013.01); *H01L 23/427* (2013.01); *H01L 23/433* (2013.01);
(Continued)

(58) Field of Classification Search
CPC .... H01L 23/3736; H05K 1/021; H05K 1/053; H05K 3/445; H05K 2201/0116; H05K 2203/1147; H05K 7/20463; H05K 7/20472; H05K 7/20481; H01M 4/8605; H01M 6/5038; H01M 8/0247; H01M 8/0258; F24H 9/0005; F28D 15/00; F28D 15/0266; F28D 15/046; F28D 2021/0028

USPC ............ 361/688, 704, 714, 717; 165/104.28; 174/252; 392/394, 395
See application file for complete search history.

(56) References Cited

U.S. PATENT DOCUMENTS 4,583,582 A 4/1986 Grossman
5,067,047 A 11/1991 Azar
(Continued)

FOREIGN PATENT DOCUMENTS

| JP | 10121110 | 5/1998 |
|---|---|---|
| WO | 98/44307 | 10/1996 |
| WO | WO2005029555 | 3/2005 |

OTHER PUBLICATIONS

Z. Q. Chen et al., "An experimental study of two phase flow and boiling heat transfer in bi-dispersed porous channels," available at http://www.me.ust.hk/~mezhao/pdf/49.PDF.
(Continued)

*Primary Examiner* — Hung S Bui
*Assistant Examiner* — Michael Matey
(74) *Attorney, Agent, or Firm* — Dinsmore & Shohl LLP

(57) ABSTRACT

Cooling assemblies and power electronics modules having multiple-level porosity structures with both a micro- and macro-level porosity are disclosed. In one embodiment, a cooling assembly includes a jet impingement assembly including a fluid inlet channel fluidly coupled an array of orifices provided in a jet plate, and a heat transfer substrate having a surface. The heat transfer substrate is spaced apart from the jet plate. A first array of metal fibers is bonded to the surface of the heat transfer substrate in a first direction, and a second array of metal fibers is bonded to the first array of metal fibers in a second direction. Each metal fiber of the first array of metal fibers and the second array of metal fibers includes a plurality of metal particles defining a micro-porosity. The first array of metal fibers and the second array of metal fibers define a macro-porosity.

20 Claims, 12 Drawing Sheets

(51) Int. Cl.
*H01L 23/427* (2006.01)
*H01L 23/373* (2006.01)

(52) U.S. Cl.
CPC ......... *H01L23/4735* (2013.01); *H01L 23/3736* (2013.01); *H01L 2224/16225* (2013.01); *H01L 2924/0002* (2013.01); *H01L 2924/13055* (2013.01)

(56) References Cited

U.S. PATENT DOCUMENTS

| | | | | |
|---|---|---|---|---|
| 5,402,004 | A * | 3/1995 | Ozmat | H01L 23/147 257/717 |
| 5,561,987 | A * | 10/1996 | Hartfield | B01D 1/04 165/117 |
| 6,018,459 | A * | 1/2000 | Carlson | F28F 13/003 165/80.3 |
| 6,123,145 | A | 9/2000 | Glezer et al. | |
| 6,367,543 | B1 * | 4/2002 | Calaman | F28F 3/022 165/134.1 |
| 6,423,252 | B1 * | 7/2002 | Chun | A61L 27/507 264/101 |
| 6,952,346 | B2 | 10/2005 | Tilton et al. | |
| 6,958,912 | B2 * | 10/2005 | Pokharna | H01L 23/427 165/185 |
| 6,986,382 | B2 | 1/2006 | Upadhya et al. | |
| 6,988,535 | B2 | 1/2006 | Upadhya et al. | |
| 7,044,199 | B2 * | 5/2006 | Thayer | H01L 23/3733 165/104.28 |
| 7,104,312 | B2 * | 9/2006 | Goodson | F04B 19/006 165/104.33 |
| 7,277,283 | B2 | 10/2007 | Campbell et al. | |
| 7,331,377 | B1 * | 2/2008 | Toy | F28F 13/185 165/80.4 |
| 7,375,962 | B2 | 5/2008 | Campbell et al. | |
| 7,511,957 | B2 | 3/2009 | Campbell et al. | |
| 7,530,778 | B2 | 5/2009 | Yassour et al. | |
| 7,571,618 | B2 | 8/2009 | Dessiatoun | |
| 7,597,135 | B2 | 10/2009 | Ghosh et al. | |
| 7,639,030 | B2 | 12/2009 | Wadell | |
| 7,762,314 | B2 | 7/2010 | Campbell et al. | |
| 7,841,843 | B2 | 11/2010 | Cho et al. | |
| 7,885,074 | B2 | 2/2011 | Campbell et al. | |
| 7,921,664 | B2 | 4/2011 | Rini et al. | |
| 7,942,997 | B2 | 5/2011 | Rivas et al. | |
| 7,992,627 | B2 | 8/2011 | Bezama et al. | |
| 8,059,405 | B2 | 11/2011 | Campbell et al. | |
| 8,074,706 | B2 | 12/2011 | Su et al. | |
| 8,077,460 | B1 | 12/2011 | Dede et al. | |
| 8,081,461 | B2 | 12/2011 | Campbell et al. | |
| 8,118,084 | B2 | 2/2012 | Harvey | |
| 8,194,406 | B2 | 6/2012 | Campbell et al. | |
| 8,391,008 | B2 | 3/2013 | Dede | |
| 8,596,341 | B2 * | 12/2013 | Tegrotenhuis | F25B 37/00 165/104.26 |
| 2007/0084587 | A1 | 4/2007 | Huang et al. | |
| 2007/0119565 | A1 | 5/2007 | Brunschwiler et al. | |
| 2008/0210407 | A1 * | 9/2008 | Kim | F28D 15/0233 165/104.26 |
| 2008/0282892 | A1 * | 11/2008 | Deckman | B01D 53/0407 96/140 |
| 2009/0314467 | A1 * | 12/2009 | Campbell | H01L 23/4735 165/80.4 |
| 2010/0044018 | A1 | 2/2010 | Furberg et al. | |
| 2010/0097760 | A1 | 4/2010 | Azar et al. | |
| 2010/0328888 | A1 * | 12/2010 | Campbell | H01L 23/4735 361/699 |
| 2011/0146955 | A1 | 6/2011 | Chen | |
| 2011/0272120 | A1 | 11/2011 | Joshi et al. | |
| 2012/0097368 | A1 | 4/2012 | Chen et al. | |
| 2012/0168145 | A1 | 7/2012 | Peterson et al. | |
| 2012/0170222 | A1 | 7/2012 | Dede | |
| 2012/0181005 | A1 | 7/2012 | Downing | |
| 2012/0212907 | A1 | 8/2012 | Dede | |
| 2012/0279684 | A1 | 11/2012 | Keisling et al. | |
| 2013/0020059 | A1 | 1/2013 | Park | |
| 2013/0258595 | A1 * | 10/2013 | Tuckerman | H01L 23/3677 361/701 |

OTHER PUBLICATIONS

Palm et al., "Enhancement of Boiling Heat transfer by Application of a Porous Layer," available at: http://www.energy.kth.se/index.asp?pnr=10&ID=125&lang=0.
Zhao, Zenghui, "Enhanced heat transfer with jet impingement on structured-porous surfaces," available at http://ieeexplore.ieee.org/xpl/login.jsp?tp=&arnumber=6231577&url=http%3A%2F%2Fieeexplore.ieee.org%2Fxpls%2Fabs_all.jsp%3Farnumber%3D6231577.
J. P. Li, et al., Porous Ti6Al4V scaffold directly fabricating by rapid prototyping: Preparation and in vitro experiment; Science Direct; Biomaterials 27 (2006) 1223-1235.
Amon, Cristina H., S. C. Yao, C.F. Wu, and C. C. Hsieh. "Microelectronnechanical System-Based Evaporative Thermal Management of High Heat Flux Electronics." Journal of Heat Transfer, 2005:66-75.
Brignoni, L., Garimella, S., "Performance Characteristics of Confined Impinging Air Jets with Surface Enhancement," Advances in Electronic Packaging, vol. 26-2, 1999: 2009-2014.
El-Sheikh, H., Garimella, S., "Heat Transfer from Pin-Fin Heat Sinks under Multiple Impinging Jets," IEEE Transactions on Advanced Packaging, vol. 23-1, 2000: 113-120.
http://academiccommons.columbia.edu/catalog/ac%3A131465; "Micro-Evaporator Design and Investigation of Phase Change in Tailored Microchannels"; Selin Arslan; Graduate School of Arts and Sciences, Columbia University, 2011.
http://digitalcommons.mcmaster.ca/cgi/viewcontent.cgi?article=7365&context=opendissertations; "Effect of surface finish on boiling heat transfer at stagnation point under free liquid jet impingement".
http://www.sciencedirect.com/science/article/pii/S0017931098003378; "An experimental study of slot jet impingement cooling on concave surface: effects of nozzle configuration and curvature".
Lay, J. H., and V.K. Dhir. "Nucleate Boiling Heat Flux Enhancement on Macro/Micro-Structured Surfaces Cooled by an Impinging Jet." Journal of Enhanced Heat Transfer, 1995: 177-88.
Sung, M. K., Mudawar, I., "Single-phase and two-phase cooling using hybrid micro-channel/slot-jet module." Int. J. of Heat and Mass Transfer, 51, 2008: 3825-2839.
https://engineering.purdue.edu/CTRC/research/projects/A_JetImpingement_oneslider2011.pdf; "Two-Phase Liquid Jet Impingement Cooling"; S. V. Garimella, D.A. West; Purdue University, Cooling Technologies Research Center.
https://www.lboro.ac.uk/research/iemrc/documents/EventsDocuments/3rd%20conference%202008/Presentations/opt%20cooling%20Skuriat%20notts.pdf; "Optimum Cooling Solutions for Power Electronics"; Robert Skuriat, Nottingham University, Jul. 4, 2008.
Brunschwiler, T., H. Rothuizen, M. Fabbri, U. Kloter, B. Michel, R.J. Benzama, and G. Natarajan. Direct Liquid Jet-Impingement Cooling With Micron-Sized Nozzle Array and Distributed Return Architecture. Proc. of the Tenth Intersociety Conference on Thermal and Thermomechanical Phenomena in Electronics Systems, San Diego, CA, 2006: 196-203.
Wadsworth, D.C., Mudawar, I., "Cooling of a Multichip Electronic Module by Means of Confined Two-Dimensional jets of dielectric liquid," Transactions of the ASME Journal of Heat Transfer, vol. 112, 1990: 891-898.
Notice of Allowance relating to U.S. Appl. No. 13/734,710, mailed Oct. 2, 2013.
U.S. Appl. No. 13/683,660, filed Nov. 21, 2012 entitled "Cooling Apparatuses Having Sloped Vapor Outlet Channels".

* cited by examiner

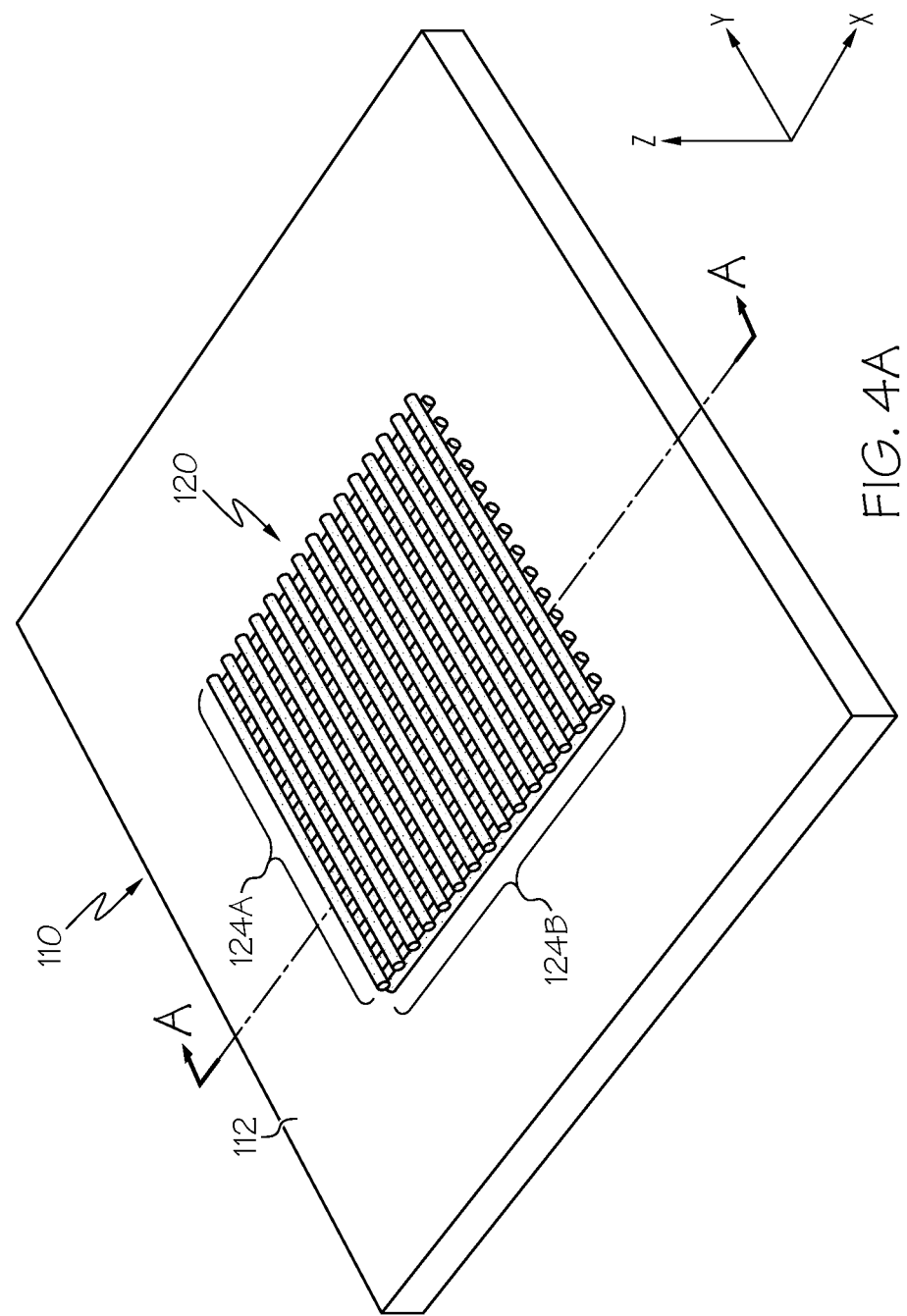

COOLING ASSEMBLIES AND POWER ELECTRONICS MODULES HAVING MULTIPLE-POROSITY STRUCTURES

TECHNICAL FIELD

The present specification generally relates to cooling assemblies and, more particularly, to cooling assemblies and power electronics modules incorporating multiple-level porosity structures.

BACKGROUND

Heat generating devices, such as power semiconductor devices, may be coupled to a heat spreader to remove heat and lower the maximum operating temperature of the heat generating device. In some applications, cooling fluid may be used to receive heat generated by the heat generating device by convective thermal transfer, and remove such heat from the heat generating device. In two-phase heat cooling devices, heat transfer is provided by the phase-change of the cooling fluid from a liquid to a vapor by nucleation. Rough or porous surfaces provide additional nucleation sites to encourage boiling. In addition to two-phase heat transfer, jet impingement may also be used to cool a heat generating device by directing impingement jets of cooling fluid onto the heat generating device or a target surface that is thermally coupled to the heat generating device.

Accordingly, a need exists for structures that provide for increased nucleation site density for enhanced thermal performance in two-phase cooling assemblies.

SUMMARY

In one embodiment, a cooling assembly includes a heat transfer substrate having a surface, a first array of metal fibers bonded to the surface of the heat transfer substrate in a first direction, and a second array of metal fibers bonded to the first array of metal fibers in a second direction. Each metal fiber of the first array of metal fibers and the second array of metal fibers includes a plurality of metal particles defining a micro-porosity. The first array of metal fibers and the second array of metal fibers define a macro-porosity.

In another embodiment, a cooling assembly includes a jet impingement assembly including a fluid inlet channel fluidly coupled an array of orifices provided in a jet plate, and a heat transfer substrate having a surface. The heat transfer substrate is spaced apart from the jet plate. A first array of metal fibers is bonded to the surface of the heat transfer substrate in a first direction, and a second array of metal fibers is bonded to the first array of metal fibers in a second direction. Each metal fiber of the first array of metal fibers and the second array of metal fibers includes a plurality of metal particles defining a micro-porosity. The first array of metal fibers and the second array of metal fibers define a macro-porosity.

In yet another embodiment, a power electronics module includes a cooling assembly and a power semiconductor device. The cooling assembly includes a heat transfer substrate having a first surface and a second surface, a first array of metal fibers bonded to the first surface of the heat transfer substrate in a first direction, and a second array of metal fibers bonded to the first array of metal fibers in a second direction. Each metal fiber of the first array of metal fibers and the second array of metal fibers includes a plurality of metal particles defining a micro-porosity, and the first array of metal fibers and the second array of metal fibers define a macro-porosity. The power semiconductor device is thermally coupled to the second surface of the heat transfer substrate.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 4A schematically depicts a cooling assembly comprising a second array of metal fibers disposed on a first array of metal fibers according to one or more embodiments described and illustrated herein;

DETAILED DESCRIPTION

Referring generally to the figures, embodiments of the present disclosure are directed to two-phase cooling assemblies comprising alternating arrays of metal (or metal alloy) fibers bonded to a surface of a heat transfer substrate. The alternating arrays of metal fibers define a multiple-porosity structure on the heat transfer substrate that improves two-phase heat transfer by creating multiple sites for nucleate boiling to occur. In embodiments, a cooling fluid is introduced (e.g., by jet impingement or passive fluid flow) into a vapor chamber. A heat generating device, such as a power semiconductor device, heats the heat transfer substrate and the multiple-porosity structure such that cooling fluid present on the multiple-porosity structure changes phase from liquid to vapor, thereby removing heat flux from the heat transfer substrate. The multiple-level porosity structure comprises a macro-level porosity defined by the arrangement of the individual metal fibers of the alternating arrays of metal fibers, and a micro-porosity defined by the metal fibers themselves. More specifically, the metal fibers comprise small metal particles (e.g., 10 μm-100 μm) that are bonded together by a heat treatment process (e.g., sintering). The metal particles of the metal fibers define a micro-level porosity. Accordingly, the multiple-level porosity structure has both a micro- and macro-level porosity to increase nucleation site density, increase available heat transfer area, provide for capillary assisted flow of cooling fluid, and provide additional paths for vapor to escape from the micro-level pores. Various embodiments of cooling assemblies, power electronics modules incorporating cooling assemblies, and methods of making cooling assemblies with arrays of metal fibers are described herein below.

Figure 1:
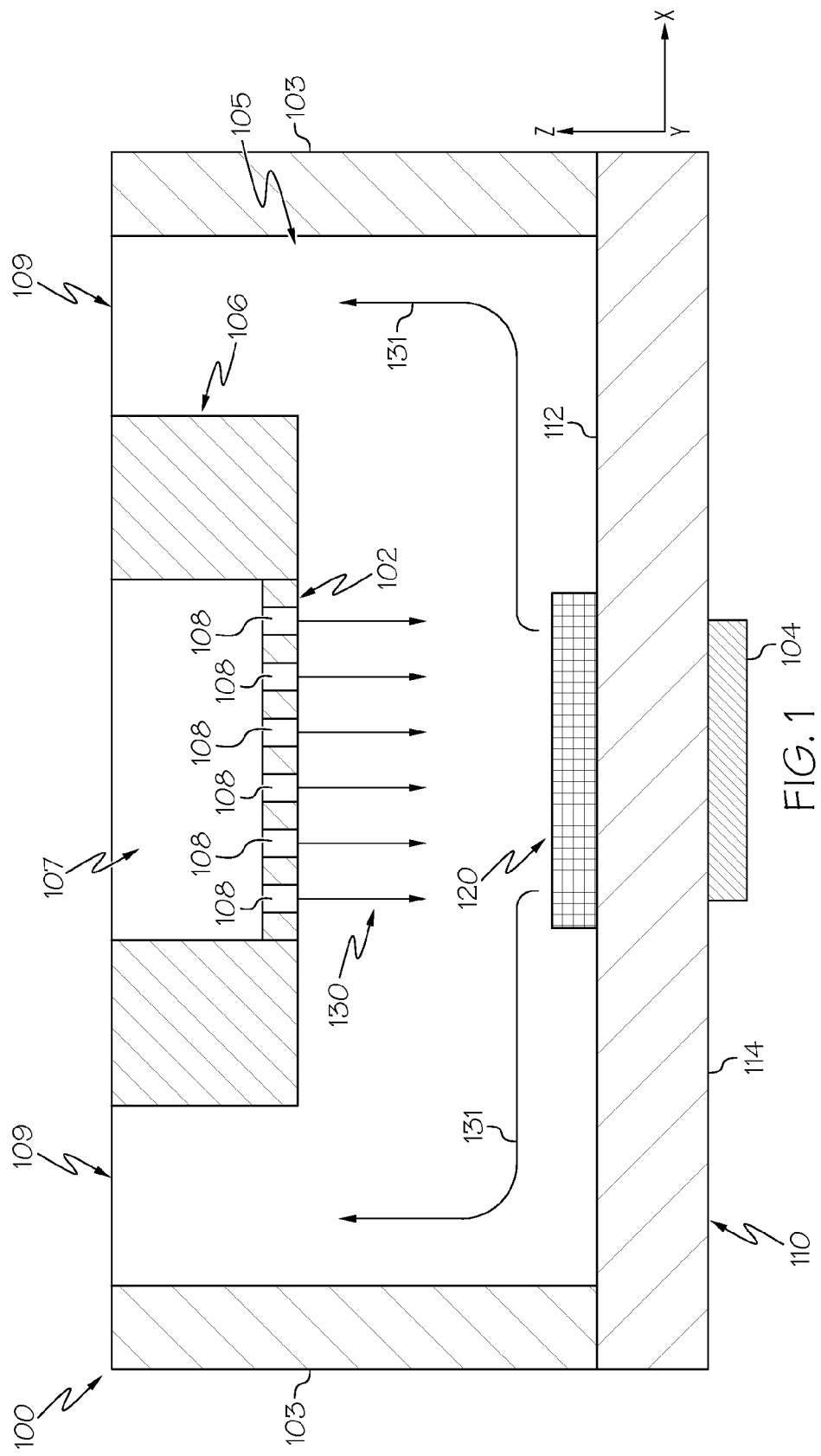
FIG. 1 schematically depicts a cross sectional view of a cooling assembly including a multiple-level porosity structure according to one or more embodiments described and illustrated herein.

Referring now to FIG. 1, an exemplary power electronics module 100 comprising a heat generating device 104 thermally coupled to a two-phase cooling assembly 101 is schematically depicted. The heat generating device 104 may be any device that generates heat, such as, for example, semiconductor devices. Semiconductor devices may include, but are not limited to, insulated gate bipolar transistors (IGBT), metal-oxide-semiconductor field effect transistors (MOSFET), power diodes, power bipolar transistors, power thyristor devices, and the like. As an example and not a limitation, the semiconductor device and associated power electronics module 100 may be included as a component in an inverter and/or converter circuit used to provide electrical power to high load devices, such as electric motors in electrified vehicles (e.g., hybrid vehicles, plug-in hybrid electric vehicles, plug-in electric vehicles, and the like). It should be understood that the cooling assemblies described herein may also be used to cool heat generating devices other than semiconductor devices (e.g., mechanical devices, such as motors).

The cooling assembly 101 generally includes a heat transfer substrate 110, an impingement chamber 105 defined in part by an assembly body 103, a multiple-level porosity structure 120 thermally coupled to the heat transfer substrate, and an impingement jet assembly 106 configured to direct jets of cooling fluid 130 toward the multiple-level porosity structure 120. It is noted that the illustrated cooling assembly 101 is configured as an impingement jet device wherein the jets of cooling fluid 130 impinge the heat transfer substrate 110 and the multiple-level porosity structure 120. However, embodiments are not limited to impingement jet devices. For example, in an alternative embodiment, the cooling fluid may flow across the multiple-level porosity structure 120 without direct impingement.

The heat transfer substrate 110 includes a first surface 112 (i.e., a target surface that receives the cooling fluid) and a second surface 114 (i.e., a heat transfer surface). The heat generating device 104 is thermally coupled to the second surface 114 of the heat transfer substrate 110 by any appropriate method including, but not limited to, solder, thermal paste, brazing, clamping and the like. The heat transfer substrate 110 may be made of a thermally conductive material (e.g., a metal or metal alloy) to receive heat flux created by the heat generating device 104. Exemplary materials for the heat transfer substrate 110 include, but are not limited to, copper, aluminum, and gold. Thermally conductive ceramic materials may also be used, such as alumina and aluminum nitride, for example.

Figure 4B:
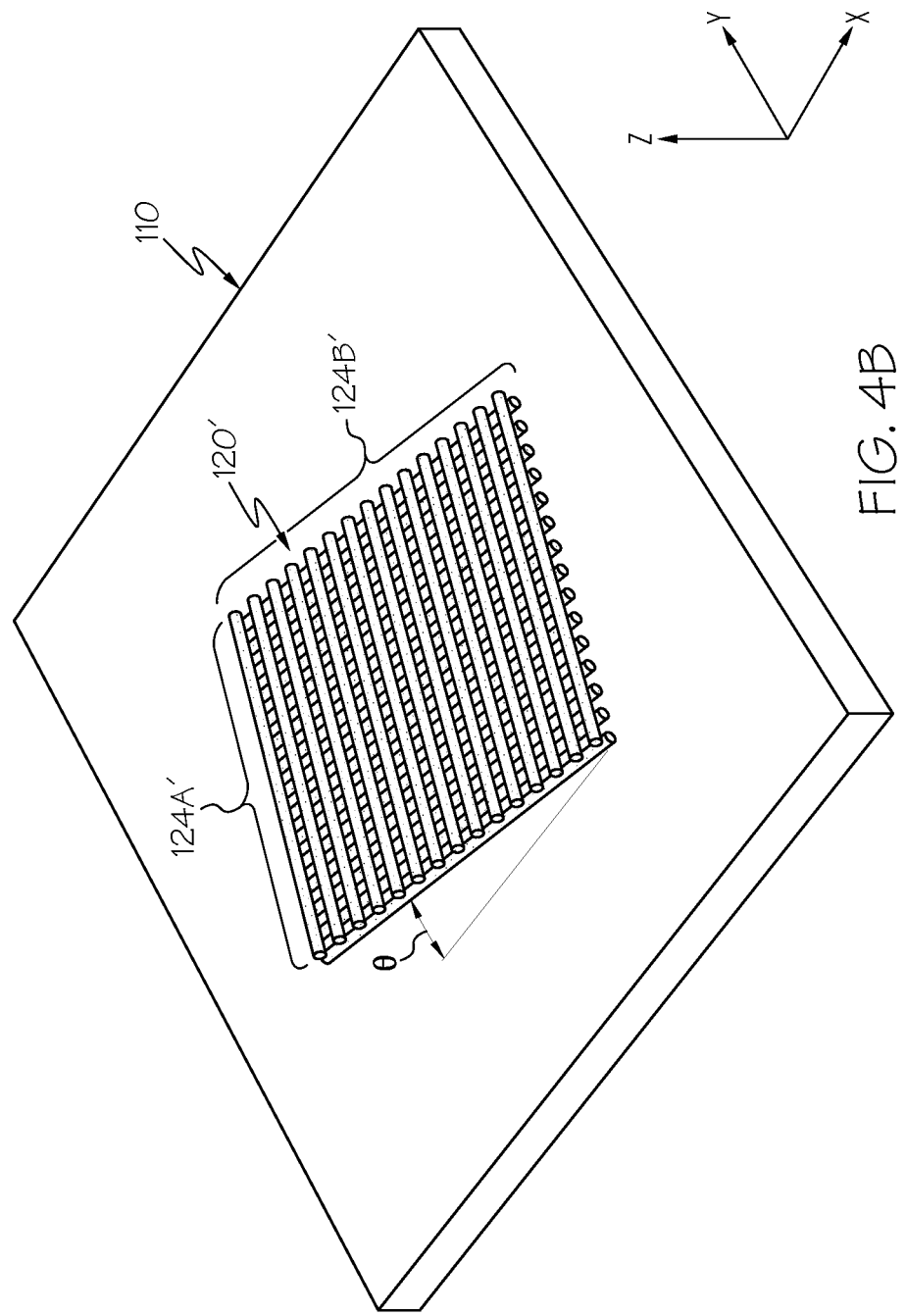
FIG. 4B schematically depicts a cooling assembly comprising a second array of metal fibers disposed on a first array of metal fibers wherein the first and second metal fibers are angled with respect to edges of a heat transfer substrate according to one or more embodiments described and illustrated herein.

Referring briefly to FIG. 4A, the multiple-level porosity structure 120, which includes a macro-level porosity and a micro-level porosity, is fabricated from at least two arrays 124A, 124B of metal fibers arranged on top of one another. The multiple-level porosity structure 120 is bonded to the first surface 112 of the heat transfer substrate 110 (e.g., by sintering or diffusion bonding) at a location to receive cooling fluid 130 in the form of jets 130. The multiple-level porosity structure 120 is located on the first surface 112 of the heat transfer substrate 110 opposite from the heat generating device 104 on the second surface 114 (i.e., the multiple-level porosity structure 120 of the illustrated embodiment is aligned with the heat generating device 104 on the x-axis). The multiple-level porosity structure 120 is described in detail below. In some embodiments, as depicted in FIG. 4B, the multiple-level porosity structure 120' may be rotated by an angle θ with respect to the x- or y-axis and the edges of the heat transfer substrate 110 such that the impingement jets that impinge the first surface 112 do not share the same channels (i.e., the area between individual metal fibers), thereby improving coolant fluid flow. As an example and not a limitation, the multiple-level porosity structure 120 may be positioned on the first surface 112 such that it is angled between about 5 to about 10 degrees with respect to the x-axis. As another non-limiting example, the angle θ may be about 7.125 degrees, and the metal fibers of the first and second arrays of metal fibers 124A', 124B' may have a diameter of about 0.150 mm with 0.150 mm metal fiber spacing. Other dimensions may also be used.

The impingement jet assembly 106 includes a fluid input channel 107 through which cooling fluid flows from a fluid inlet (not shown). Examples of cooling fluids that may be used in conjunction with the cooling assembly 101 include a variety of fluids including, for example and without limitation, water, organic solvents, and inorganic solvents. Selection of the composition of the fluid used in association with the cooling assembly 101 may be selected based on, among other properties, the boiling point and the density of the fluid.

The illustrate impingement jet assembly 106 comprises a jet plate 102 having an array of orifices 108 through which the cooling fluid flows as high velocity impingement jets 130 that impinge the multiple-level porosity structure 120 and the first surface 112 of the heat transfer substrate. The heat flux provided by the heat generating device 104 changes the cooling fluid 130 from a liquid to a vapor 131 for two-phase heat transfer within the impingement chamber 105. The vapor 131 moves away from the multiple-level porosity structure 120 and flows toward a vapor outlet 109, which in the illustrated embodiment is located on a top surface of the cooling assembly 101. Alternatively, the vapor outlet 109 may be provided on one or more sides of the cooling assembly 101. As described in more detail below, the multiple levels of porosity of the multiple-level porosity structure 120 assists in the boiling of the cooling fluid. The vapor may be condensed and then returned to the cooling assembly 101 in a closed-loop system.

The impingement chamber 105 is defined by the heat transfer substrate 110, the assembly body 103, and the impingement jet assembly 106. The assembly body 103, which may also be fabricated from a thermally conductive material in some embodiments, may be bonded to the heat transfer substrate 110. Alternatively, the assembly body 103 and the heat transfer substrate 110 may be configured as a single, integral component.

Fabrication of the multiple-level porosity structure 120 on the first surface 112 of the heat transfer substrate 110 will now be described. Generally, the multiple-level porosity structure 120 may be fabricated by a three-dimensional scaffolding technique (e.g., by three-dimensional printing) that deposits individual metal fibers comprised of small metal (or metal alloy) particles onto a surface (e.g., metal particles having an average diameter of about 10 μm to about 100 μm). The small metal particles of the individual metal fibers provide a micro-level porosity, while the open spaces between the individual metal fibers provide a macro-level porosity.

Figure 2:
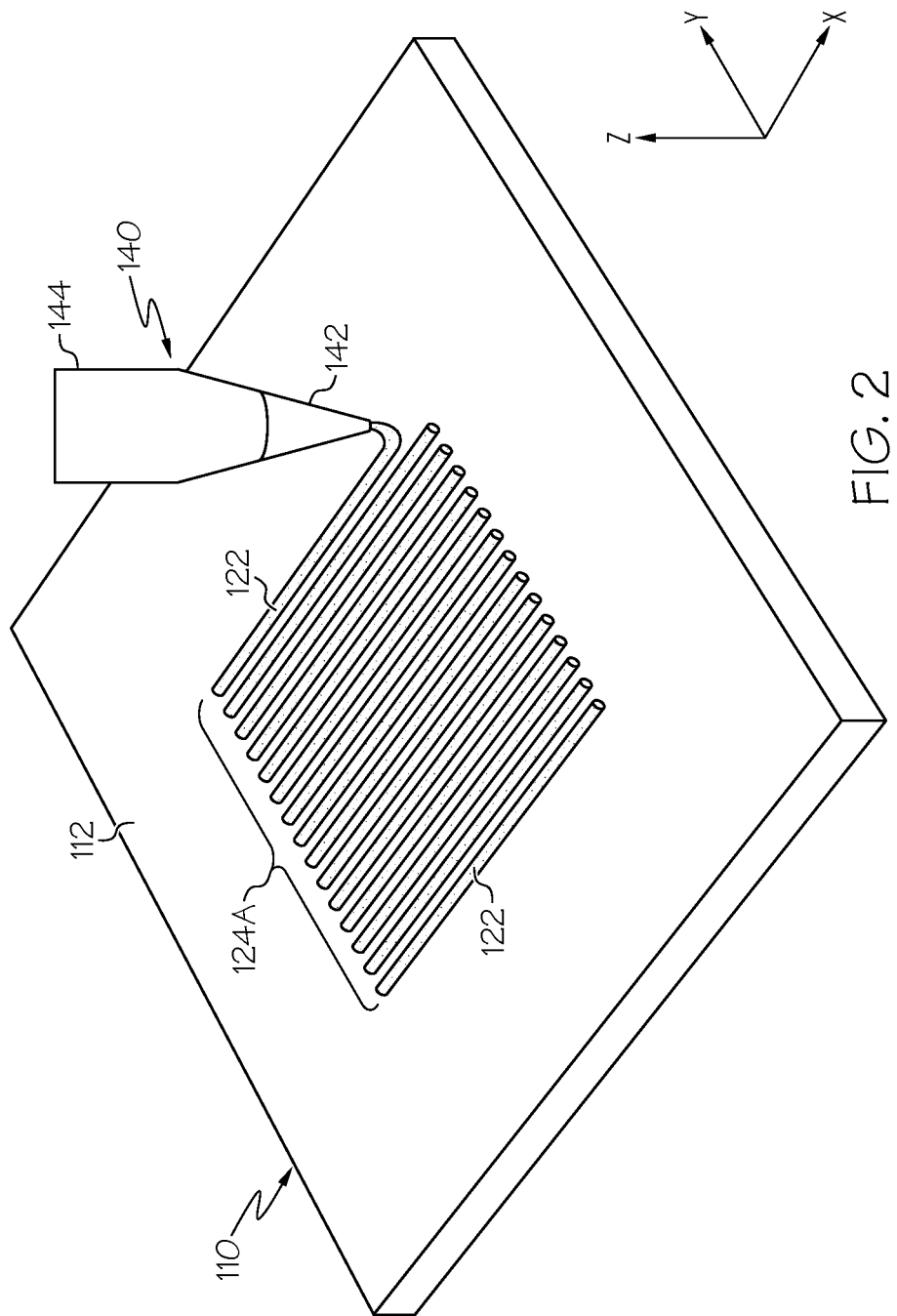
FIG. 2 schematically depicts metal fibers of a first array of metal fibers on a surface of a heat transfer substrate in a first direction according to one or more embodiments described and illustrated herein.

Referring now to FIG. 2, individual porous metal fibers 122 are deposited onto the first surface 112 of the heat transfer substrate 110 by a three-dimensional scaffolding process. As illustrated in FIG. 2, the individual porous metal fibers 122 may be deposited such that they form an array 124A in a first direction. The individual porous metal fibers 122 may be formed by ejection of a metal particle solution (i.e., slurry) from a nozzle 142 of a printing head 140. As an example and not a limitation, the metal particle solution may be maintained in a reservoir 144 and then forced out of the nozzle and onto the heat transfer substrate 110. The width and the spacing of the porous metal fibers may be chosen according to the macro-level porosity that is desired (e.g., the micron or millimeter scale). In some embodiments, the macro-level porosity is between about 50% and about 70% porous.

Figure 3:
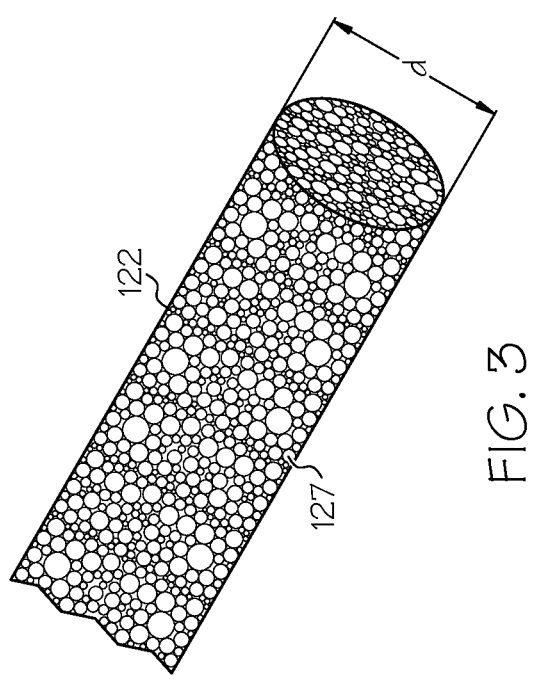
FIG. 3 schematically depicts a partial close-up view of a metal fiber according to one or more embodiments described and illustrated herein.

Referring now to FIG. 3, a partial, close-up view of an individual porous metal fiber 122 prior to heating is schematically depicted. The metal particle solution that is deposited onto the heat transfer substrate 110 as porous metal fibers 122 comprises small metal particles 127. As an example and not a limitation, the diameter d of the metal fibers 122 may be between about 0.050 mm and about 0.0200 mm. However, it should be understood that embodiments are not limited to metal fibers 122 of any particular dimension. The material chosen for the small metal particles 127 of the porous metal fibers 122 should be chosen to be the same as, or similar to, the material chosen for the heat transfer substrate 110 to enable the porous metal fibers 122 to bond to the first surface 112 of the heat transfer substrate 110 during a subsequent thermal process (e.g., diffusion bonding or sintering). For example, both the small metal particles 127 of the metal particle solution and the heat transfer substrate 110 may be copper (i.e., copper particles that define copper fibers when deposited on a copper substrate) or other metals or metal alloys.

The metal particle solution is configured such that the shape of the metal fibers 122 is substantially maintained after being deposited on the heat transfer substrate 110. Accordingly, a binder material and a dispersant material may also be included in the metal particle solution to maintain the metal particles in the shape of the metal fibers 122 after the metal particle solution is deposited and before the assembly is heated treated to bond the individual metal particles together (e.g., by sintering or diffusion bonding), to bond the arrays of metal fibers together, and the bond the bottom-most array of metal fibers (e.g., array 124A depicted in FIG. 2) to the first surface 112 of the heat transfer substrate 110.

The metal particle solution should be such that the metal fibers 122 have a desired micro-level porosity (e.g., between about 50% and about 70% porous). Because the metal particles 127 are very small, such as metal particles having an average diameter between about 10 μm and about 100 μm, the individual metal fibers 122 have a micro-level porosity, which, as described in more detail below, increase nucleation sites for the boiling of the cooling fluid within the impingement chamber 105.

As shown in FIG. 2, porous metal fibers 122 are deposited in a first direction (e.g., on the x-axis) to form a first array of metal fibers 124A in direct contact with the first surface 112 of the heat transfer substrate 110. Although the individual porous metal fibers 122 are illustrated as parallel to one another in the first array of metal fibers 124A, embodiments are not limited thereto. Referring now to FIG. 4A, the metal particle solution deposition process described above is repeated by depositing porous metal fibers 122 on top of the porous metal fibers 122 of the first array of metal fibers 124A in a second direction (e.g., on the y-axis), thereby forming a second array of metal fibers 124B that is stacked on the first array of metal fibers 124A in the z-axis direction. In the illustrated embodiment, the individual porous metal fibers 122 of the second array of metal fibers 124B are orthogonal to the individual porous metal fibers 122 of the first array of metal fibers 124B. However, in alternative embodiments, the second array of metal fibers 124B may be non-orthogonal with respect to the first array of metal fibers 124A. The first and second arrays of metal fibers 124A, 124B define the multiple-level porosity structure 120. As described in more detail below, multiple-level porosity structures 120 having more than two layers or arrays of metal fibers are also contemplated.

In some embodiments, the average diameter of the metal particles 127 within the metal fibers 122 of the first array of metal fibers 124A is substantially equal to the average diameter of the metal particles 127 within the metal fibers 122 of the second array of metal fibers 124B. In other embodiments, the average diameter of the metal particles 127 within the metal fibers 122 of the first array of metal fibers 124A is different from the average diameter of the metal particles 127 within the metal fibers 122 of the second array of metal fibers 124B. For example, in embodiments, average diameter of the metal particles 127 within the metal fibers 122 of the first array of metal fibers 124A is greater than the average diameter of the metal particles 127 within the metal fibers 122 of the second array of metal fibers 124B. In this arrangement, the difference in metal particle size and micro-level porosity between the first and second arrays of metal fibers 124A, 124B may provide a pumping capillary action of cooling fluid away from the first surface 112 of the heat transfer substrate 110 in the z-direction, which may improve heat transfer efficiency of the cooling assembly 101.

Figure 5:
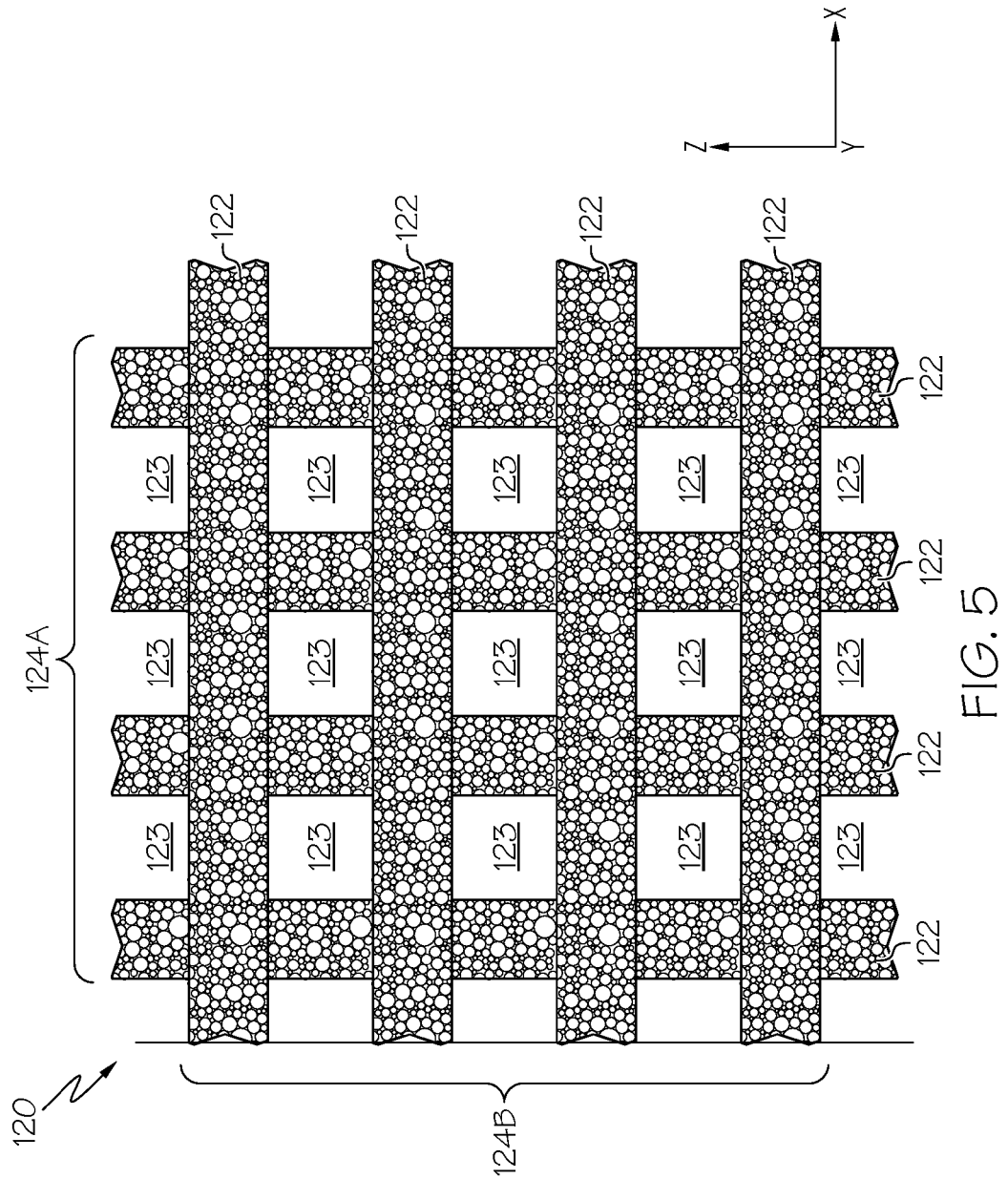
FIG. 5 schematically depicts a partial top-down view of a multiple-level porosity structure according to one or more embodiments described and illustrated herein.
Figure 6:
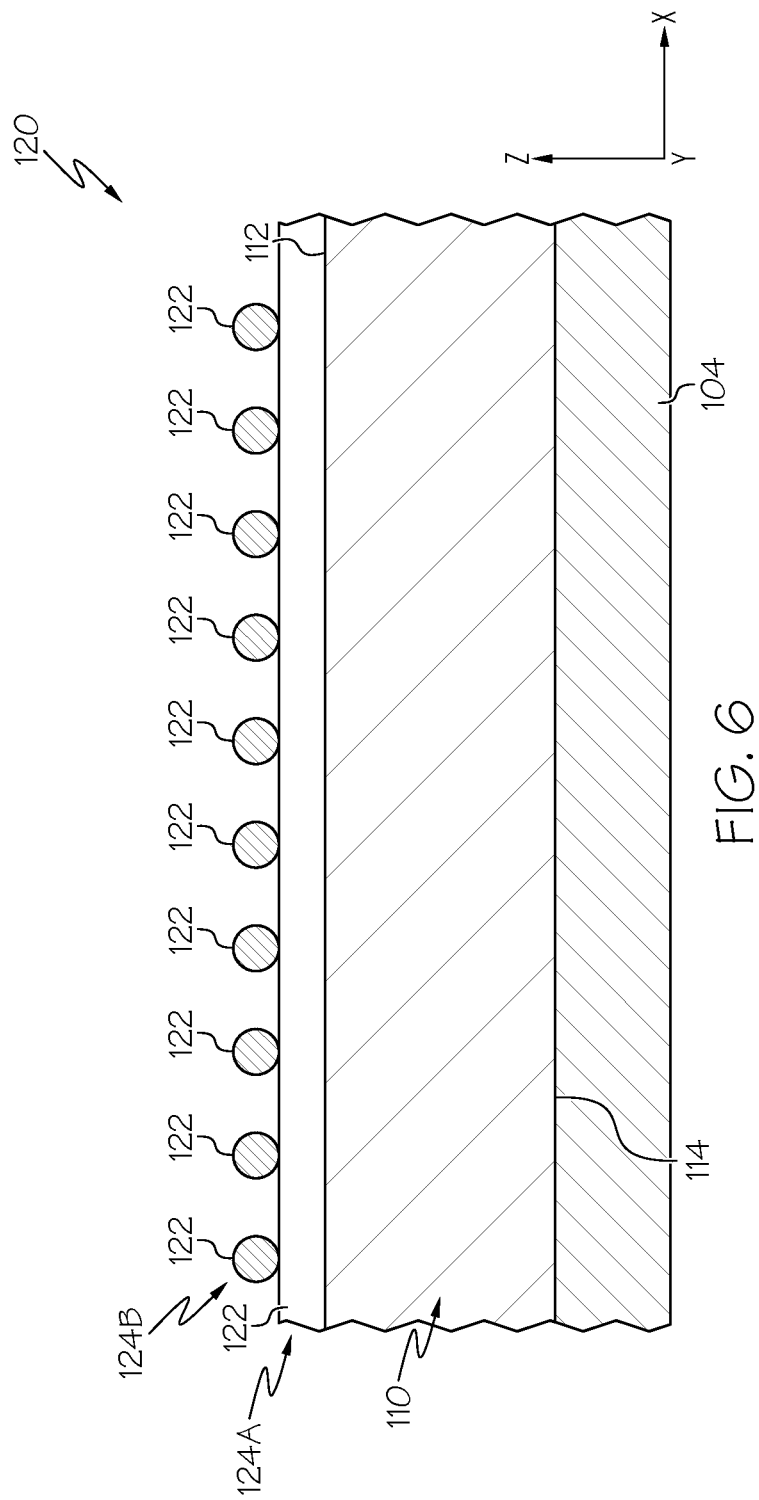
FIG. 6 schematically depicts a partial cross-sectional view of the cooling assembly taken along line A-A of FIG. 4A.
Figure 7:
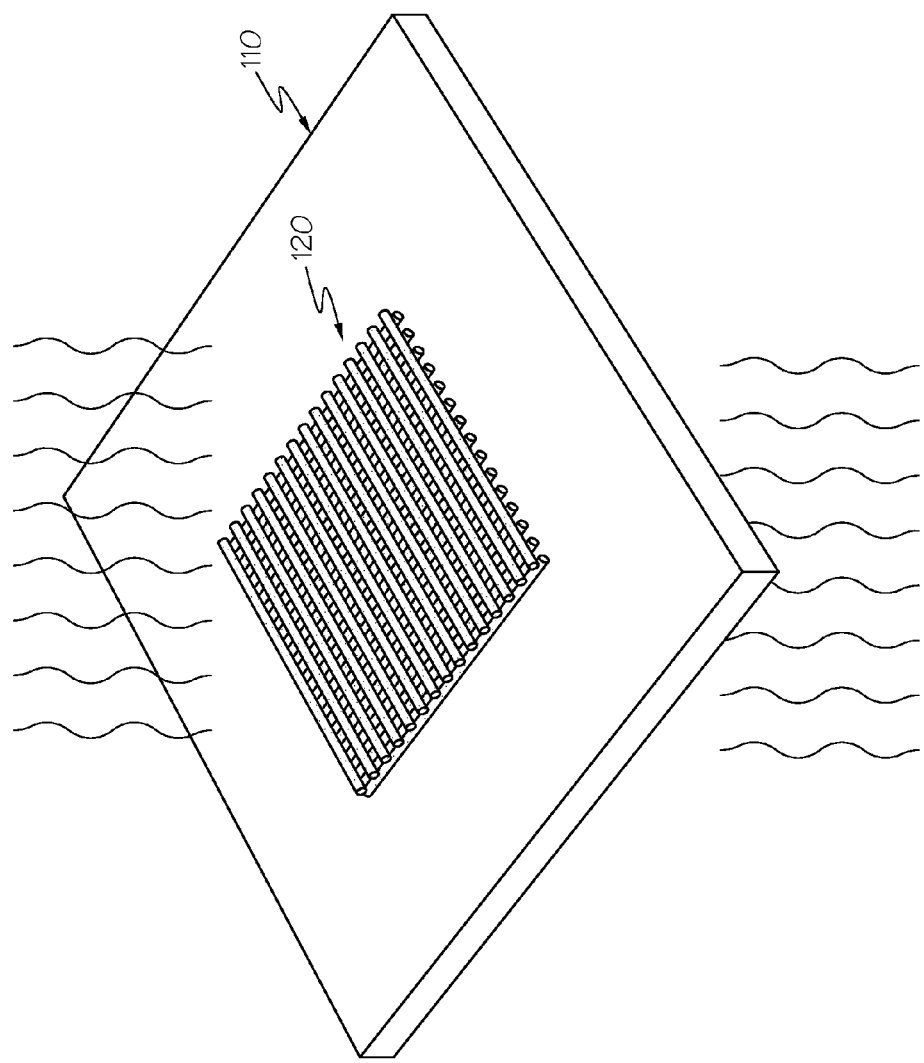
FIG. 7 schematically depicts a heat treatment process to bond the multiple-level porosity structure to the heat transfer substrate according to one or more embodiments described and illustrated herein.

Referring now to FIG. 5, a partial top-down view of a multiple-level porosity structure 120 is schematically depicted. In this embodiment, the second array of metal fibers 124B is stacked on top of the first array of metal fibers 124A such that the porous metal fibers 122 of the second array of metal fibers 124B are orthogonal to the porous metal fibers 122 of the first array of metal fibers 124A. Such an arrangement defines an array of open cells 123 between the porous metal fibers 122 of the first and second array of metal fibers 124A, 124B. The open cells 123 define a macro-level porosity of the multiple-level porosity structure 120. As an example and not a limitation, the open cells 123 may be such that the multiple-level porosity structure is about 50% to about 70% porous at the macro level. Accordingly, the multiple-level porosity structure 120 has a macro-level porosity due to the open cells 123, and a micro-level porosity due to the individual metal particles 127 of the metal fibers 122. FIG. 6 depicts a partial cross-sectional view of the heat transfer substrate 110 and multiple-level porosity structure 120 taken along line A-A of FIG. 4A. FIG. 6 illustrates the porous metal fibers 122 of the second array of metal fibers 124B deposited on the porous metal fibers 122 of the first array of metal fibers 124A.

After depositing the first and second arrays of metal fibers 124A, 124B, the heat transfer substrate 110 and the first and second arrays of metal fibers 124A, 124B are heated to a bonding temperature for a bonding time. In some embodiments, the first and second arrays of metal fibers 124A, 124B may be dried for a drying duration prior to heat treatment. The bonding temperature and bonding time are such that the metal particles 127 of the metal fibers 122 are sintered to bond the metal fibers 122. Accordingly, the bonding temperature should be less than the melting point of the metal particles. The binder material is evaporated during the heat treatment process. The binder material, bonding temperature, and bonding time should be such that the metal particles 127 are sintered without causing significant sagging or deformation of the metal fibers 122 of the second array of metal fibers 124B. Further, the bonding temperature and bonding time should be such that the sintered metal fibers 122 have the desired micro-level porosity after the heat treatment process.

During the heat treatment process, the individual metal particles 127 are bonded together by sintering, which also bonds the second array of the metal fibers 124B to the first array of metal fibers 124A, and the first array of metal fibers 124A to the first surface 112 of the heat transfer substrate 110. Accordingly, a rigid multiple-level porosity structure 120 for receiving impingement jets of cooling fluid is bonded to the heat transfer substrate 110. Additional details regarding processes and parameters for fabrication of the layered arrays of metal fibers according to an example embodiment employing $Ti_6Al_4V$ particles are provided in Jia Ping Li et al., *Porous $Ti_6Al_4V$ scaffold directly fabricating by rapid prototyping: Preparation and in vitro experiment*, Biomaterials 27, 1223-1235, Oct. 5, 2005, which is hereby incorporated by reference herein in its entirety. It should be understood that other processes and parameters may be utilized to fabricate the layered arrays of metal fibers, and embodiments described herein are not limited to any particular process. As an example and not a limitation, in some embodiments each array of metal fibers may be deposited and sintered individually prior to being stacked and bonded to each other to form the multiple-level porous structure 120.

Referring generally to FIGS. 1 and 4-6, the functionality of the power electronics module 100 including the cooling assembly 101 will now be described. Jets of cooling fluid 130 exit the orifices 108 of the impingement jet assembly 106 and impinge the multiple-level porosity structure 120 and the first surface 112 of the heat transfer substrate 110. As stated above, in other embodiments, the cooling fluid may be introduced in a non-impinging manner (e.g., through an inlet that allows the cooling fluid to flow across the first surface 112 of the heat transfer substrate 110). The heat transfer substrate 110 and the multiple-level porosity structure 120 are at an elevated temperature due to the heat flux generated by the heat generating device 104. Heat is transferred from the multiple-level porosity structure 120 and the heat transfer substrate 110 to the cooling fluid 130 upon impingement and flow within the multiple-level porosity structure 120 and on the first surface 112.

The high temperature causes the cooling fluid 130 to change phase from a liquid to a vapor within the impingement chamber 105. The micro-level porosity of the individual metal fibers 122 of the multiple-level porosity structure 120 provide for increased nucleating site density over a flat, non-porous surface, thereby promoting nucleation. The three dimensional, open cell structure of the multiple-level porosity structure 120 also provides for increased surface area for nucleation and heat transfer to the cooling fluid. Additionally, both the micro-level porosity and the macro-level porosity of the multiple-level porosity structure 120 provides volume for the vapor to escape from the multiple-level porosity structure 120 and away from the heat generating device 104, thereby increasing heat transfer efficiency. Further, the micro-level porosity of the multiple-level porosity structure 120 provides heat transfer enhancement due to the capillary assisted flow of coolant fluid. In embodiments, as shown in FIG. 1, vapor may be removed from the impingement chamber 105 through one or more vapor outlets 109.

Embodiments may include a multiple-level porosity structure having more than two arrays of metal fibers (i.e., one or more additional arrays of metal fibers). The inclusion of additional arrays of metal fibers allows the multiple-level porosity structure to expand in the z-direction, which provides for additional nucleation sites and increased available heat transfer area.

Figure 8:
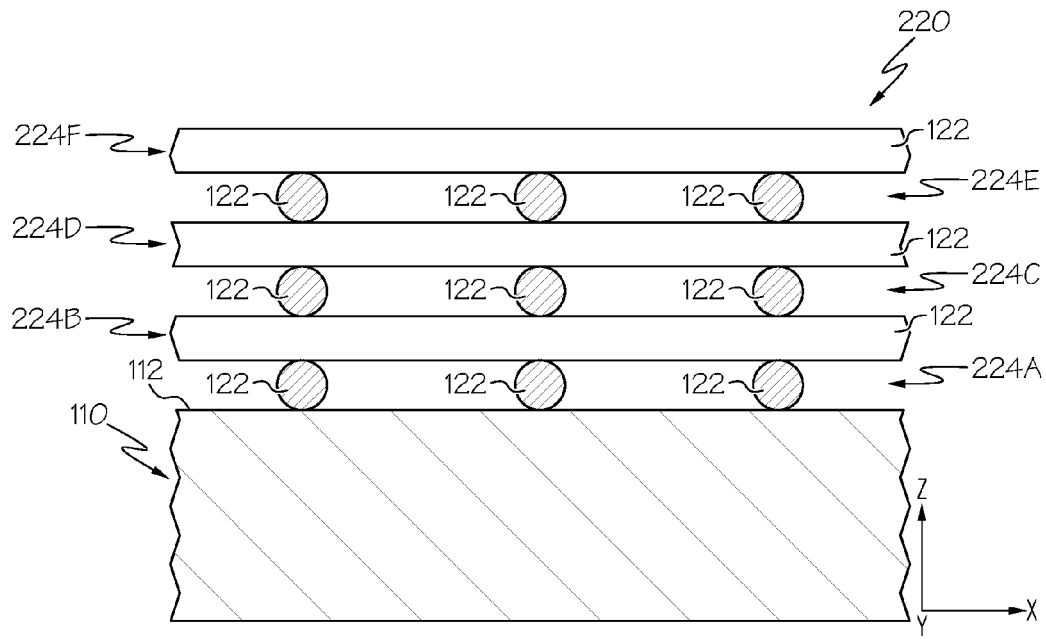
FIG. 8 schematically depicts a partial side view of a multiple-level porosity structure having six stacked arrays of metal fibers according to one or more embodiments described and illustrated herein.

FIG. 8 illustrates a multiple-level porosity structure 220 bonded to a heat transfer surface 110 that includes alternating arrays of metal fibers in the form of: a first array of metal fibers 224A bonded to a first surface 112 of the heat transfer substrate 110; a second array of metal fibers 224B disposed on the first array of metal fibers 224A and in a direction orthogonal to the first array of metal fibers 224A; a third array of metal fibers 224C disposed on the second array of metal fibers 224B and in a direction parallel to the first array of metal fibers 224A; a fourth array of metal fibers 224D disposed on the third array of metal fibers 224C and in a direction parallel to the second array of metal fibers 224B; a fifth array of metal fibers 224E disposed on the fourth array of metal fibers 224D and in a direction parallel to the first array of metal fibers 224A; and a sixth array of metal fibers 224F disposed on the fifth array of metal fibers 224E and in a direction parallel to the second array of metal fibers 224B. In the illustrated embodiment, the individual metal fibers 122 of the first, third and fifth arrays of metal fibers 224A, 224C, and 224E are aligned with one another on the x-axis, while the individual metal fibers 122 of the second, fourth, and sixth arrays of metal fibers 224B, 224D, and 224F are aligned with one another on the y-axis.

Figure 9:
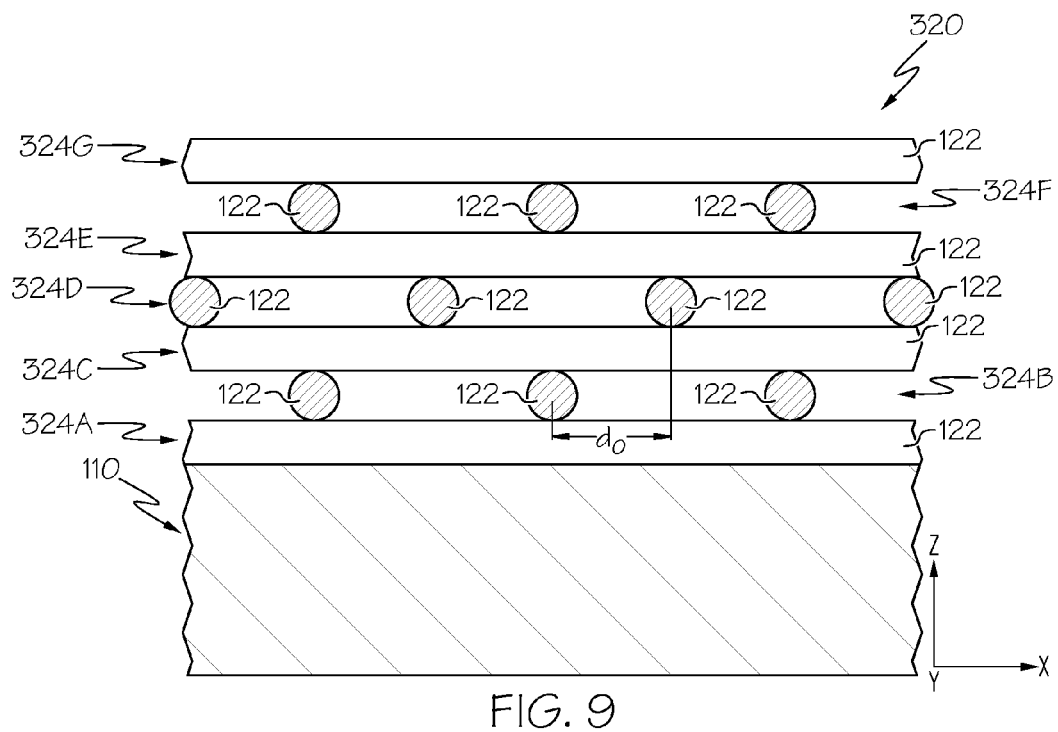
FIG. 9 schematically depicts a partial side view of a multiple-level porosity structure having seven stacked arrays of metal fibers according to one or more embodiments described and illustrated herein.

FIG. 9 depicts an embodiment similar to the embodiment depicted in FIG. 8 except that the individual metal fibers 122 of first through seventh arrays of metal fibers 324A-324G are staggered on the x- and y-axes. For example, the individual metal fibers 122 of the fourth array of metal fibers 324D are offset from individual metal fibers 122 of the second and sixth arrays of metal fibers 324B, 324F by an offset distance $d_o$ on the x-axis. The individual metal fibers 122 of the first, third, fifth and seventh arrays of metal fibers 324A, 324C, 324E, and 324G are similarly arranged on the y-axis. It should be understood that other arrangements are also possible.

Figure 10:
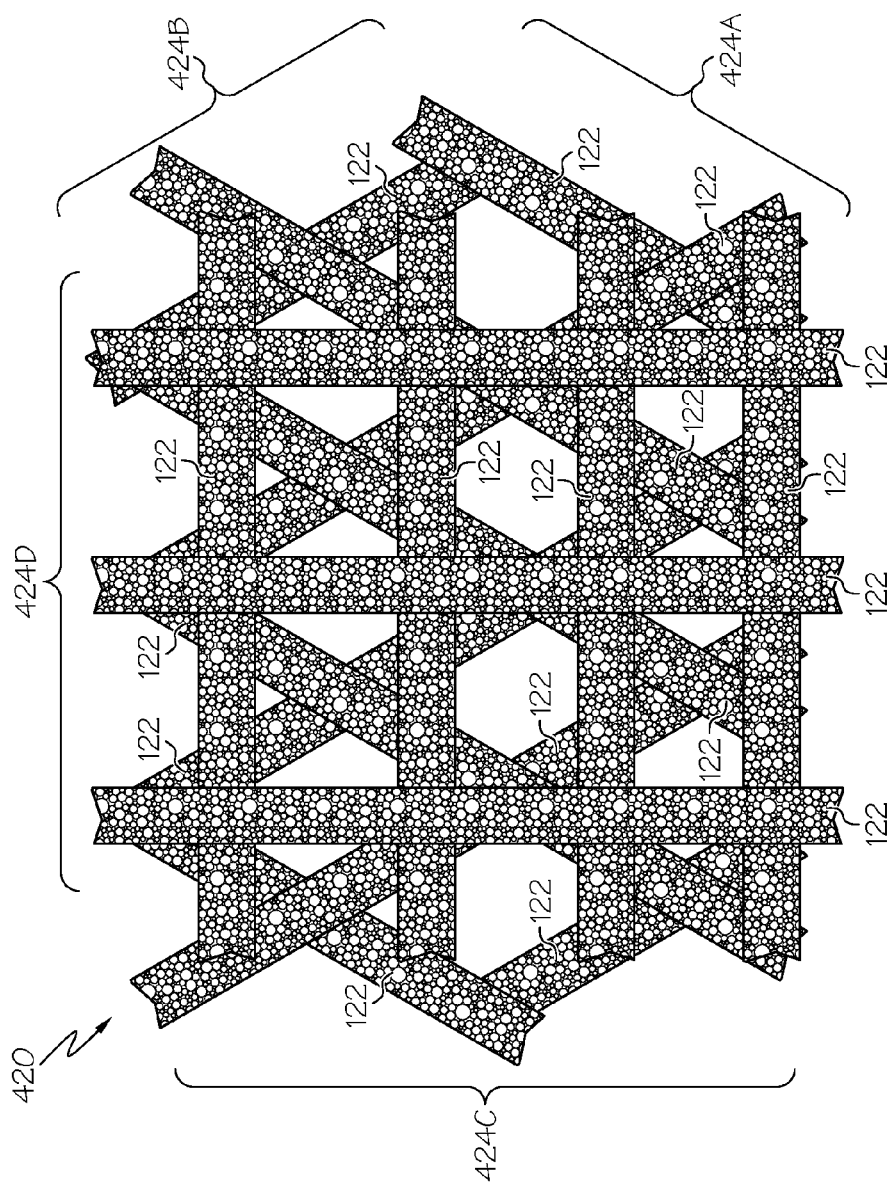
FIG. 10 schematically depicts a multiple-level porosity structure having several transverse arrays of metal fibers according to one or more embodiments described and illustrated herein.

In some embodiments, the alternating arrays of metal fibers are transverse, but are not orthogonal, with respect to one another. In other embodiments, some alternating arrays of metal fibers are orthogonal with respect to one another, but others are not. Referring to FIG. 10, an example multiple-level porous structure 420 is illustrated. In this embodiment, first and second arrays of metal fiber 424A, 424B are transverse but not orthogonal with respect to one another. A third array of metal fiber 424C is transversely disposed on top of the second array of metal fiber 424B, while a fourth array of metal fiber 424D is orthogonally disposed on the third array of metal fiber 424C. Many other configurations are also possible, such as curved metal fibers disposed on a heat transfer substrate.

Figure 11:
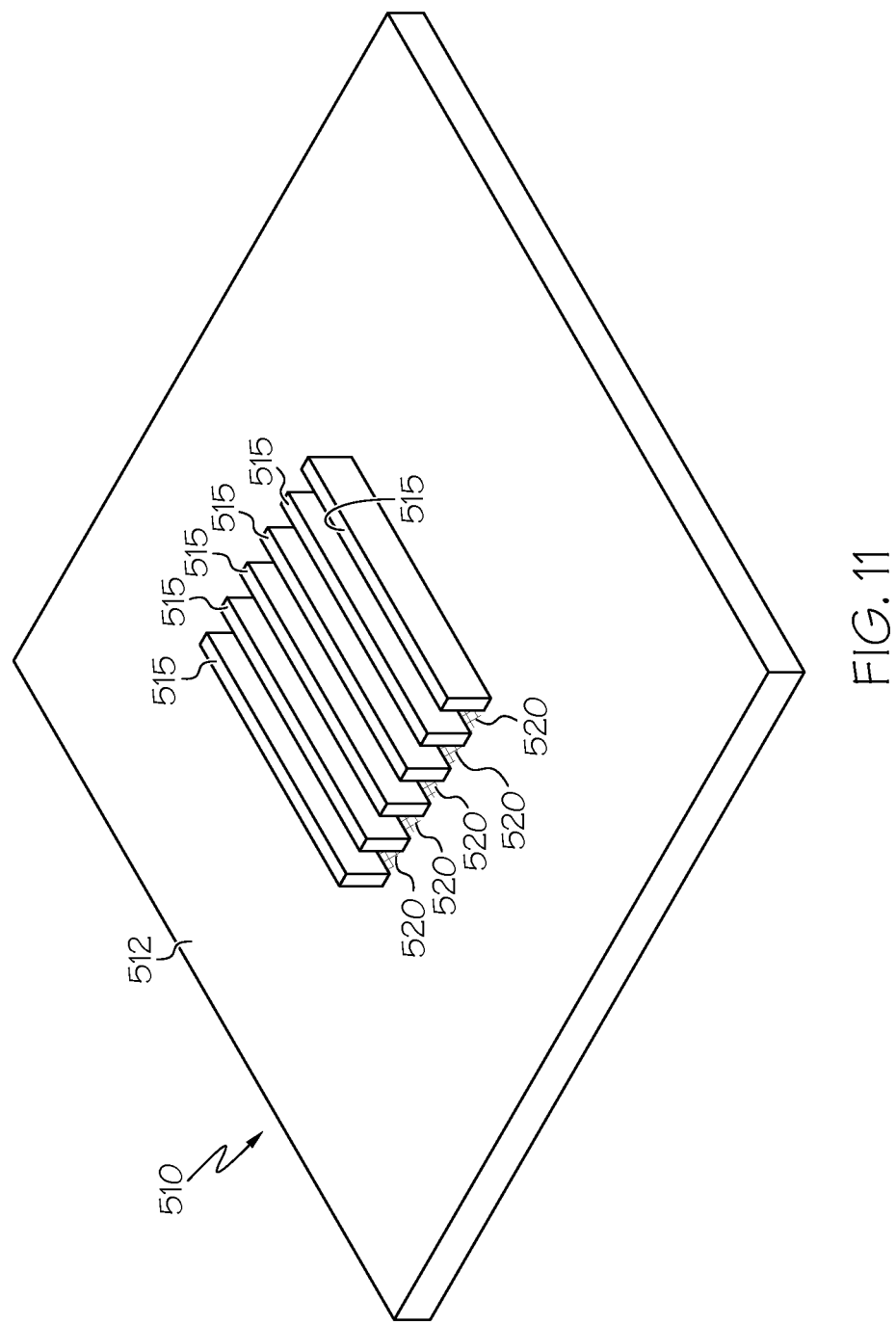
FIG. 11 schematically depicts a heat transfer substrate having an array of fins with a multiple-level porosity structure disposed between adjacent fins according to one or more embodiments described and illustrated herein.
Figure 12:
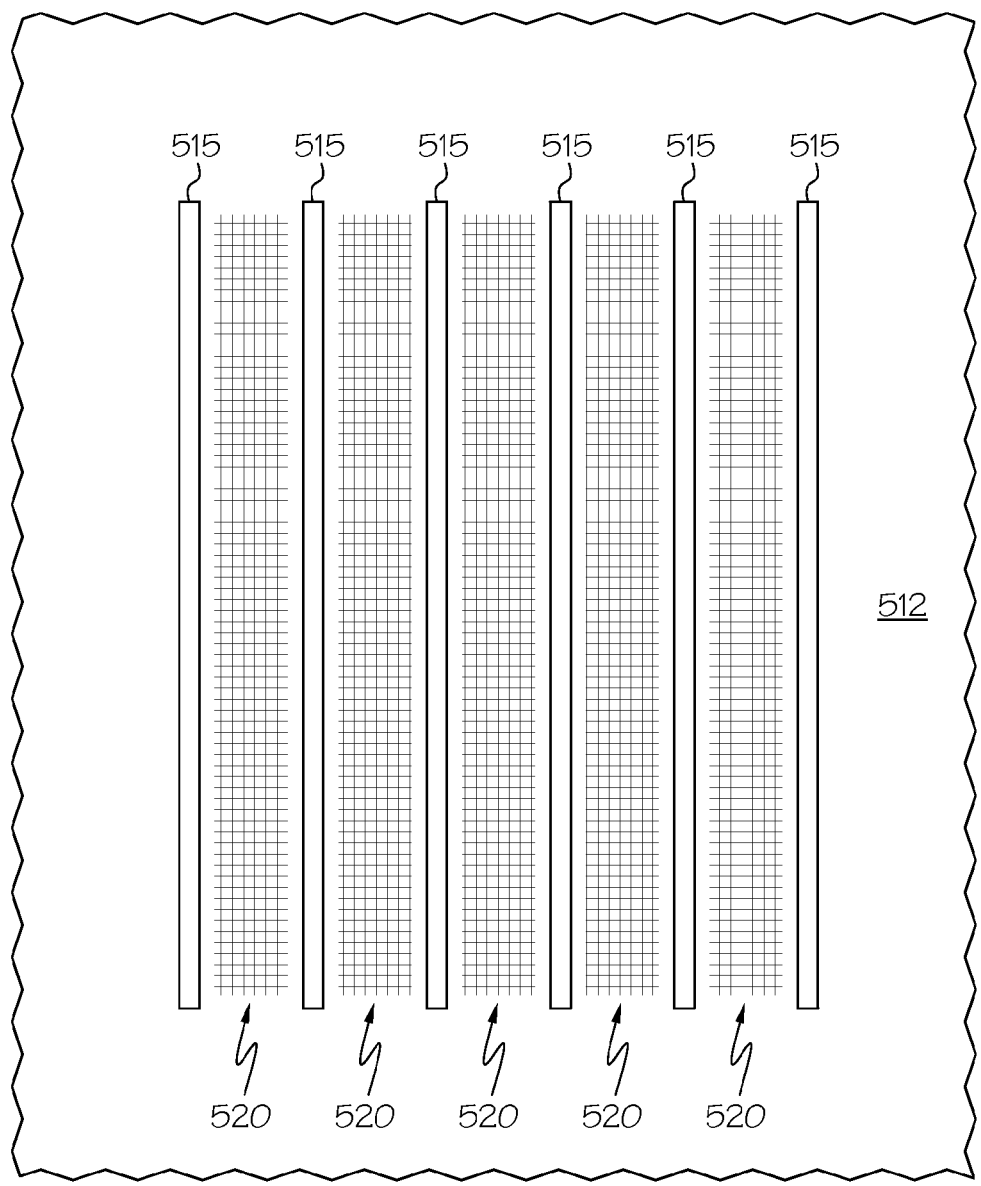
FIG. 12 schematically depicts a partial top-down view of the array of fins and multiple-level porosity structures of the heat transfer substrate depicted in FIG. 11.

The multiple-level porous structures described above may also be provided on the heat transfer substrate in addition to other surface enhancement features. FIGS. 11 and 12 depict an embodiment wherein a heat transfer substrate 510 includes thermally conductive fins 515 that extend from a first surface 512. The fins 515, which may be configured as straight fins as depicted in FIG. 11 or as pin fins or other configurations, act as heat sink fins to increase the heat transfer area of the heat transfer substrate 510. The height and width, as well as the spacing between adjacent fins, may depend on the particular application. Any number of fins 515 may be provided in any configuration.

In the illustrated embodiment, a multiple-level porosity structure 520 is provided between adjacent fins 515. The multiple-level porosity structures 520, which may be fabricated as described above, provide for additional nucleation site density between the fins 515 where the jets of coolant fluid impinge. In other embodiments, the several multiple-level porosity structures 520 may be provided between adjacent fins 515 rather than one multiple-level porosity structure 520.

It should now be understood that embodiments described herein are directed to two-phase cooling assemblies having one or more multiple-level porosity structures comprising alternating arrays of metal (or metal alloy) fibers bonded to a surface of a heat transfer substrate. The multiple-porosity structure(s) on the heat transfer substrate may improve two-phase heat transfer by creating multiple sites for nucleate boiling to occur, increase available heat transfer area, provide enhancement due to capillary assisted flow, and provide additional paths for vapor to escape.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A cooling assembly comprising:
   a heat transfer substrate having a surface;
   a first array of metal fibers bonded to the surface of the heat transfer substrate in a first direction;
   a second array of metal fibers bonded to the first array of metal fibers in a second direction, wherein:
      each metal fiber of the first array of metal fibers and the second array of metal fibers comprises a plurality of metal particles defining a micro-porosity; and
      the first array of metal fibers and the second array of metal fibers define a macro-porosity.

2. The cooling assembly of claim 1, wherein the second direction is orthogonal to the first direction.

3. The cooling assembly of claim 1, wherein individual metal particles of the first array of metal fibers have a size that is smaller than a size of individual metal particles of the second array of metal fibers.

4. The cooling assembly of claim 1, wherein individual metal particles of the plurality of metal particles of the first array of metal fibers and the second array of metal fibers have a size between about 10 µm and about 100 µm.

5. The cooling assembly of claim 1, wherein individual metal particles of the plurality of metal particles of the first array of metal fibers and the second array of metal fibers have a porosity between about 50% and about 70%.

6. The cooling assembly of claim 1, further comprising an additional array of metal fibers bonded to the second array of metal fibers, each metal fiber of the additional array of metal fibers comprising a plurality of metal particles.

7. The cooling assembly of claim 6, wherein the additional array of metal fibers is arranged in the first direction.

8. The cooling assembly of claim 7, wherein individual metal fibers of the additional array of metal fibers are offset from individual metal fibers of the first array of metal fibers in a direction parallel to the surface of the heat transfer substrate.

9. The cooling assembly of claim 6, wherein the additional array of metal fibers is arranged transverse to the first direction and transverse to the second direction.

10. The cooling assembly of claim 1, further comprising:
    a first fin extending from the surface of the heat transfer substrate;
    a second fin extending from the surface of the heat transfer substrate, the second fin being adjacent to the first fin, wherein the first array of metal fibers and the second array of metal fibers define a multiple-level porosity structure disposed between the first fin and the second fin.

11. A cooling assembly comprising:
    a jet impingement assembly comprising a fluid inlet channel fluidly coupled an array of orifices provided in a jet plate;
    a heat transfer substrate having a surface, the heat transfer substrate spaced apart from the jet plate;
    a first array of metal fibers bonded to the surface of the heat transfer substrate in a first direction;
    a second array of metal fibers bonded to the first array of metal fibers in a second direction, wherein:
       each metal fiber of the first array of metal fibers and the second array of metal fibers comprises a plurality of metal particles defining a micro-porosity; and
       the first array of metal fibers and the second array of metal fibers define a macro-porosity.

12. The cooling assembly of claim 11, further comprising an assembly body, wherein the jet impingement assembly, the heat transfer substrate, and the assembly body define an impingement chamber.

13. The cooling assembly of claim 12, wherein the assembly body comprises at least one vapor outlet.

14. The cooling assembly of claim 11, wherein the second direction is orthogonal to the first direction.

15. The cooling assembly of claim 11, further comprising an additional array of metal fibers bonded to the second array of metal fibers, each metal fiber of the additional array of metal fibers comprising a plurality of metal particles.

16. The cooling assembly of claim 15, wherein the additional array of metal fibers is arranged transverse to the first direction and transverse to the second direction.

17. The cooling assembly of claim 11, further comprising:
    a first fin extending from the surface of the heat transfer substrate;
    a second fin extending from the surface of the heat transfer substrate, the second fin being adjacent to the first fin, wherein the first array of metal fibers and the second array of metal fibers define a multiple-level porosity structure disposed between the first fin and the second fin.

18. A power electronics module comprising
    a cooling assembly comprising:
       a heat transfer substrate having a first surface and a second surface;

a first array of metal fibers bonded to the first surface of the heat transfer substrate in a first direction;
a second array of metal fibers bonded to the first array of metal fibers in a second direction, wherein:
each metal fiber of the first array of metal fibers and the second array of metal fibers comprises a plurality of metal particles defining a micro-porosity; and
the first array of metal fibers and the second array of metal fibers define a macro-porosity; and
a power semiconductor device thermally coupled to the second surface of the heat transfer substrate.

19. The power electronics module of claim 18, wherein individual metal particles of the plurality of metal particles of the first array of metal fibers and the second array of metal fibers have a size between about 10 μm and about 100 μm.

20. The power electronics module of claim 18, further comprising an additional array of metal fibers bonded to the second array of metal fibers, each metal fiber of the additional array of metal fibers comprising a plurality of metal particles.

* * * * *